United States Patent
Cho

(10) Patent No.: US 12,000,864 B2
(45) Date of Patent: Jun. 4, 2024

(54) HIGH PERFORMANCE OUTER CYLINDRICAL SPRING PIN

(71) Applicant: Jungdon Cho, Pyeongtaek-si (KR)

(72) Inventor: Jungdon Cho, Pyeongtaek-si (KR)

( * ) Notice: Subject to any disclaimer, the term of this patent is extended or adjusted under 35 U.S.C. 154(b) by 186 days.

(21) Appl. No.: 17/789,777

(22) PCT Filed: Aug. 4, 2020

(86) PCT No.: PCT/KR2020/010275
§ 371 (c)(1),
(2) Date: Jun. 28, 2022

(87) PCT Pub. No.: WO2021/137379
PCT Pub. Date: Jul. 8, 2021

(65) Prior Publication Data
US 2023/0039251 A1  Feb. 9, 2023

(30) Foreign Application Priority Data
Dec. 30, 2019 (KR) .................. 10-2019-0177228

(51) Int. Cl.
*G01R 1/067* (2006.01)
*G01R 3/00* (2006.01)

(52) U.S. Cl.
CPC ..... *G01R 1/06722* (2013.01); *G01R 1/06738* (2013.01); *G01R 3/00* (2013.01)

(58) Field of Classification Search
CPC .............. G01R 1/06722; G01R 1/06738
See application file for complete search history.

(56) References Cited

U.S. PATENT DOCUMENTS 4,659,987 A * 4/1987 Coe .................. H01R 11/18
324/755.05

FOREIGN PATENT DOCUMENTS

| JP | 2011227035 A | 11/2011 |
|---|---|---|
| JP | 2012026772 A | 2/2012 |
| JP | 2012159390 A | 8/2012 |
| KR | 1020100054332 A | 5/2010 |
| KR | 101330995 B1 | 11/2013 |

\* cited by examiner

*Primary Examiner* — Alesa Allgood
(74) *Attorney, Agent, or Firm* — Rabin & Berdo, P.C.

(57) ABSTRACT

Proposed is an outer cylindrical spring pin including a compression spring (30), and an integrated upper probe (10) integrally provided with an upper probe portion (11) for contacting the outside, and with two upper probe side wall portions (12) which extend from the upper probe portion (11) and which surround two side surfaces facing each other, among four side surfaces of the compression spring (30). The spring pin further includes an integrated lower probe (20) integrally provided with a lower probe portion (21) for contacting the outside, and with two lower probe side wall portions (22) which extend from the lower probe portion (21) and which surround other two side surfaces between the two side surfaces. When an external force is applied, the upper and lower probe side wall portions (12 and 22) are capable of being slid on each other while being in contact with each other.

12 Claims, 8 Drawing Sheets

- PRIOR ART -

HIGH PERFORMANCE OUTER CYLINDRICAL SPRING PIN

TECHNICAL FIELD

The present disclosure relates to an outer cylindrical spring pin for realizing a high performance.

BACKGROUND ART

A spring pin (also called a 'pogo pin') can be broadly classified into two types. Among the two types, there is a spring pin (hereinafter, referred to as an 'outer cylindrical spring pin') which has an outer cylinder on an outside of a spring and through which signals, current, and so on are transmitted via the outer cylinder, and there is a spring pin which is not provided with an outer cylinder on an outside of a spring and through which signals, current, and so on are transmitted via a conductive bridge and so on that are provided inside the spring.

FIG. 1 is a view illustrating an example of a typical and conventional outer cylindrical spring pin.

As illustrated in FIG. 1, a spring pin includes an upper probe 1, a lower probe 2, a spring 3 applying an elastic force to the upper probe 1 and the lower probe 2, a cylindrical body 4 (also referred to as an 'outer cylinder') accommodating a lower end of the upper probe 1, an upper end of the lower probe 2, and the spring 3.

The upper probe 1 and the lower probe 2 are prevented from separating to the outside from the cylindrical body 4 by respectively having a first end that is caught in the cylindrical body 4, and receive the elastic force by the spring 3.

However, the spring 4 is provided for physical characteristics of adding elastic force, and has a very high electrical impedance. Therefore, an electrical path through the spring 4 is not meaningful.

Therefore, the electrical path is required to go through the cylindrical body 4. For example, in a situation in which the electrical path is used for a purpose of testing a semiconductor element, when respective ends of the upper probe 1 and the lower probe 2 are pressed, the upper probe 1 and the lower probe 2 slightly lose a balance thereof and are respectively in contact with an open portion of the cylindrical body 4.

An electrical signal is transmitted from the upper probe 1 to the cylindrical body 4 and then is transmitted from the cylindrical body 4 to the lower probe 2. Further, in this path of the electrical signal, loss of signal and loss of current mainly occur on a portion where the upper probe 1 contacts the cylindrical body 4 and on a portion where the cylindrical body 4 contacts the lower probe 2.

However, the cylindrical body 4 and the upper probe 1 are required to be relatively movable and the cylindrical body 4 and the lower probe 2 are required to be relatively movable. Further, in some cases, a vertical movement more than 100,000 times is required according to the application, so that the open portion of the cylindrical body 4 is required to maintain a distance (gap) from the upper probe 1 and the lower probe 2.

However, such a distance requirement and a requirement in which the open portion of the cylindrical body 4 stably contacts the upper probe 1 and the open portion of the cylindrical body 4 stably contacts the lower probe 2 so as to realize a smooth transmission of the electrical signal are contrary to each other.

When the distance between an inner diameter surface 41 of an upper open portion of the cylindrical body 4 and an upper outer diameter surface 11 of the upper probe 1 and the distance between another inner diameter surface 42 of a lower open portion of the cylindrical body 4 and a lower outer diameter surface 12 of the lower probe 2 are so small or absent in order to prevent damage to the electrical signal in the spring pin, a smooth movement of a probe is disturbed. Further, when the distances are so large, a possibility of causing an error or a high impedance on the connection that configures the electrical path may increase.

Due to this reason, in the conventional cylindrical spring pin, there is a problem that a strict tolerance management is required, and the strict management is associated with a high manufacturing cost.

In addition, despite these efforts and the high manufacturing cost, a contact area is not very large in the electrical contact between the upper probe 1 and the cylindrical body 4 and between the lower probe 2 and the cylindrical body 4. Therefore, these efforts do not realize satisfactory results in applications requiring high performance.

DISCLOSURE

Technical Problem

An objective of the present disclosure is to provide an outer cylindrical spring pin capable of reducing manufacturing cost, to provide a test socket using the outer cylindrical spring pin, and to provide a method of manufacturing the outer cylindrical spring pin.

Another objective of the present disclosure is to provide an outer cylindrical spring pin capable of increasing electrical characteristics, to provide a test socket using the outer cylindrical spring pin, and a method of manufacturing the outer cylindrical spring pin.

Technical Solution

According to one aspect of the present disclosure, there is provided an outer cylindrical spring pin including: a compression spring 30; an integrated upper probe 10 integrally provided with an upper probe portion 11 that is for contacting an outside, and with two upper probe side wall portions 12 which respectively extend opposite sides from each other from the upper probe portion 11 and which surround two side surfaces that are facing each other, among four side surfaces of the compression spring 30; and an integrated lower probe 20 integrally provided with a lower probe portion 21 that is for contacting the outside, and with two lower probe side wall portions 22 which respectively extend opposite sides from each other from the lower probe portion 21 and which surround other two side surfaces between the two side surfaces that is surrounded by the upper probe side wall portions 12, among the four side surfaces of the compression spring 30, wherein, when an external force is applied, the upper probe side wall portions 12 and the lower probe side wall portions 22 are capable of being slid on each other while being in contact with each other.

In the outer cylindrical spring pin, the upper probe portion 11 and the two upper probe side wall portions 12 may be configured to form a U shape, and the lower probe portion 21 and the two lower probe side wall portions 22 are configured to form a U shape.

In the outer cylindrical spring pin, each of the upper probe side wall portions 12 may include: a first linear plate 122 that extends from the upper probe portion 11 in a longitudinal direction; and a first pressing head 121 which is formed in a plate shape and which extends from the first linear plate 122 in the longitudinal direction, and each of the lower probe side wall portions 22 may include: a second linear plate 222 that extends from the lower probe portion 21 in the longitudinal direction; and a second pressing head 221 which is formed in a plate shape and which extends from the second linear plate 222 in the longitudinal direction.

In the outer cylindrical spring pin, each of the upper probe side wall portions 12 may further include a first stop protrusion 123 that protrudes from side surfaces of the first linear plate 122 so that an upward movement of the integrated upper probe 10 may be restricted by a first step portion of an insulating body 40 in which the outer cylindrical spring pin is accommodated, and each of the lower probe side wall portions 22 may further include a second stop protrusion 223 that protrudes from side surfaces of the second linear plate 222 so that a downward movement of the integrated lower probe 20 may be restricted by a second step portion of the insulating body 40 in which the outer cylindrical spring pin is accommodated.

In the outer cylindrical spring pin, the first pressing head 121 of each of the upper probe side wall portions 12 may be configured to be slid while pressing second side surfaces S2 of the second linear plate 222 of the each of the lower probe side wall portions 22, and the second pressing head 221 of each of the lower probe side wall portions 22 may be configured to be slid while pressing first side surfaces S1 of the first linear plate 122 of the each of the upper probe side wall portions 12.

In the outer cylindrical spring pin, the second pressing head 221 of each of the lower probe side wall portions 22 may be restricted from separating downward since a width of the first pressing head 121 on the each of the upper probe side wall portions 12 is wider than a width of the first linear plate 122 and protrudes, and the first pressing head 121 of each of the upper probe side wall portions 12 may be restricted from separating upward since a width of the second pressing head 221 on the each of the lower probe side wall portions 22 is wider than a width of the second linear plate 222 and protrudes.

In the outer cylindrical spring pin, the compression spring 30 may be formed by coiling a linear spring steel to be formed in a cylindrical shape, and the integrated upper probe 10 and the integrated lower probe 20 may be formed by processing a metal plate material by performing a progressive stamping that includes a punching process and a bending process.

In the outer cylindrical spring pin, the two upper probe side wall portions 12 and the two lower probe side wall portions 22 may configure a quadrangular cylinder shape, and may become an outer cylinder of the compression spring 30, thereby becoming an electrical passage where the two upper probe side wall portions 12 and the two lower probe side wall portions 22 are capable of being slid on each other.

According to one aspect of the present disclosure, there is provided a method of manufacturing an outer cylindrical spring pin, the method including: a stamping process in which an integrated upper probe 10 and an integrated lower probe 20 are manufactured by processing a metal plate material with a progressive stamping that includes a punching process and a bending process; and an assembling process in which the integrated upper probe 10 and the integrated lower probe 20 are assembled while a compression spring 30 is placed therebetween, wherein the stamping process includes: a process of bending two upper probe side wall portions 12 when the integrated upper probe 10 is manufactured, the two upper probe side wall portions 12 extending in opposite directions around an upper probe portion 11 that is for contacting an outside, such that a U shape is formed; and a process of bending two lower probe side wall portions 22 when the integrated lower probe 20 is manufactured, the two lower probe side wall portions 22 extending in opposite directions around a lower probe portion 21 that is for contacting the outside, such that a U shape is formed.

In the assembling process of the method of manufacturing the outer cylindrical spring pin, in a state in which the upper probe side wall portions 12 and the lower probe side wall portions 22 are alternately positioned from each other, the integrated upper probe 10 and the integrated lower probe 20 may be assembled by allowing a first pressing head 121 of each of the upper probe side wall portions 12 to be moved over a second pressing head 221 of each of the lower probe side wall portions 22 or by allowing the second pressing head 221 of each of the lower probe side wall portions 22 to be moved over the first pressing head 121 of each of the upper probe side wall portions 12, and the method may further include a plating process before the assembling process, the plating process performing plating of the integrated upper probe 10 and the integrated lower probe 20.

According to one aspect of the present disclosure, there is provided a test socket including: a plurality of outer cylindrical spring pins that is described above; and an insulating body having through holes which penetrate between a first surface and a second surface that is facing the first surface and which are arranged in an array, wherein the outer cylindrical spring pins may be inserted in the through holes, respectively.

Advantageous Effects

According to the present disclosure, since the outer cylindrical spring pin of the present disclosure is formed in an outer cylindrical shape and has a larger contact area, there is an effect that electrical characteristics of the outer cylindrical spring pin of the present disclosure may be drastically increased.

In addition, according to the present disclosure, a strict tolerance management required in a structure in which an outer cylinder and an upper probe are separated from each other and the outer cylinder and a lower probe are separated from each other, such as a conventional outer cylindrical spring pin, are no longer required. Therefore, there is an effect that a manufacturing cost of the outer cylindrical spring pin may be drastically reduced.

BEST MODE

Hereinafter, a first embodiment of the present disclosure will be described with reference to FIGS. 2 to 5.

Figure 1:
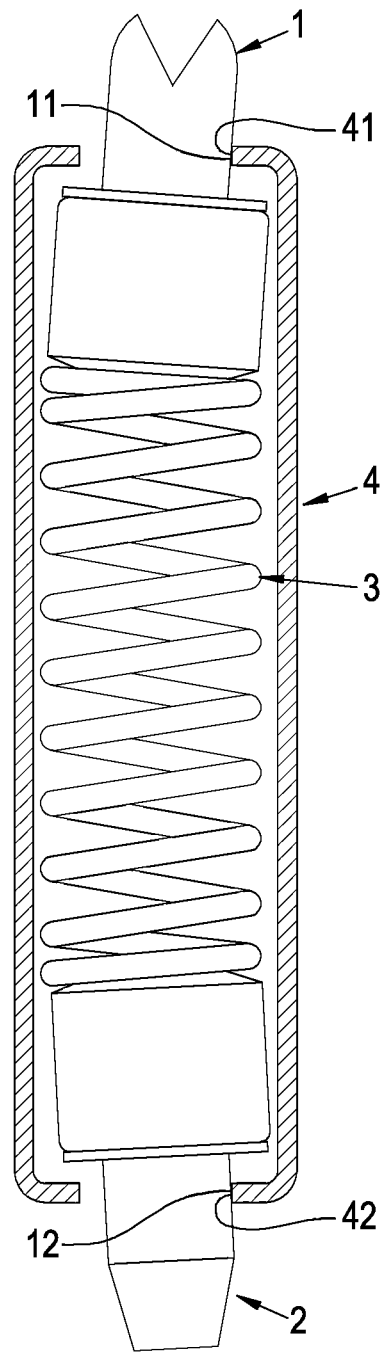
FIG. 1 is a view illustrating an example of a typical and conventional outer cylindrical spring pin.
Figure 2:
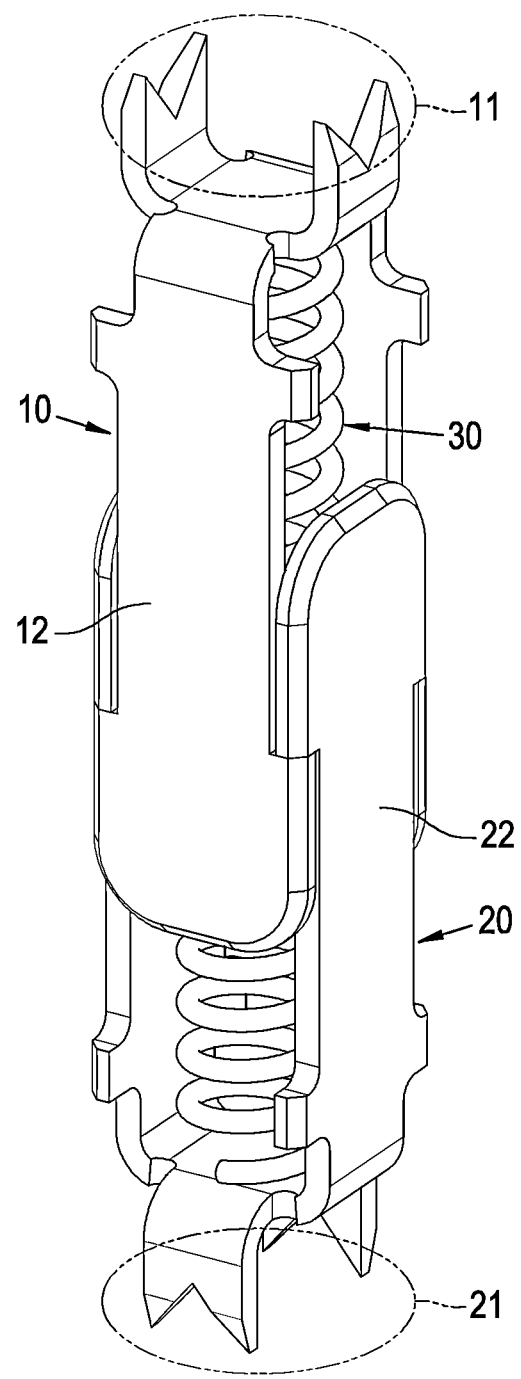
FIG. 2 is a perspective view illustrating an external appearance of an outer cylindrical spring pin according to a first embodiment of the present disclosure.
Figure 3:
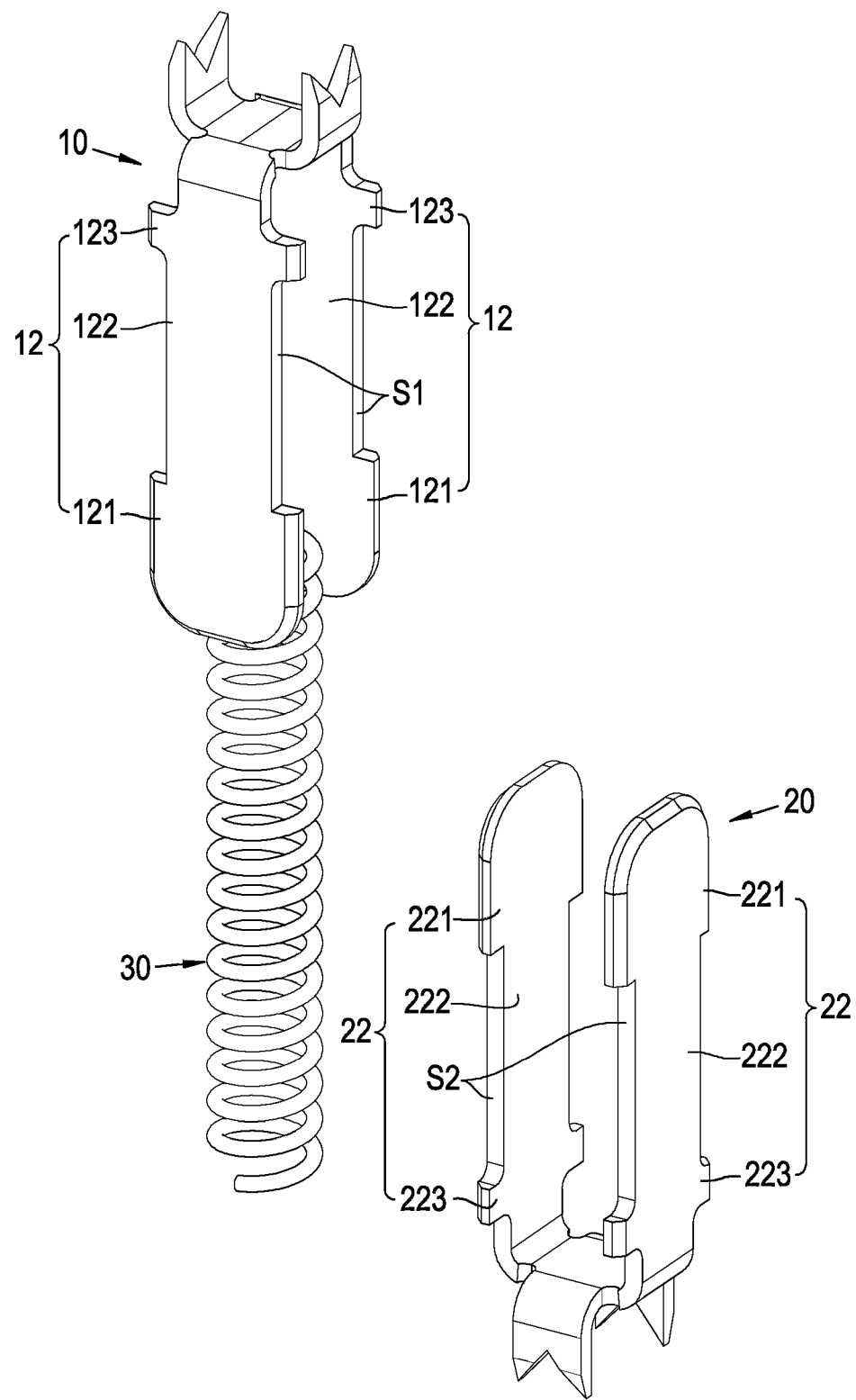
FIG. 3 is an exploded perspective view illustrating the outer cylindrical spring pin according to the first embodiment of the present disclosure.
Figure 4:
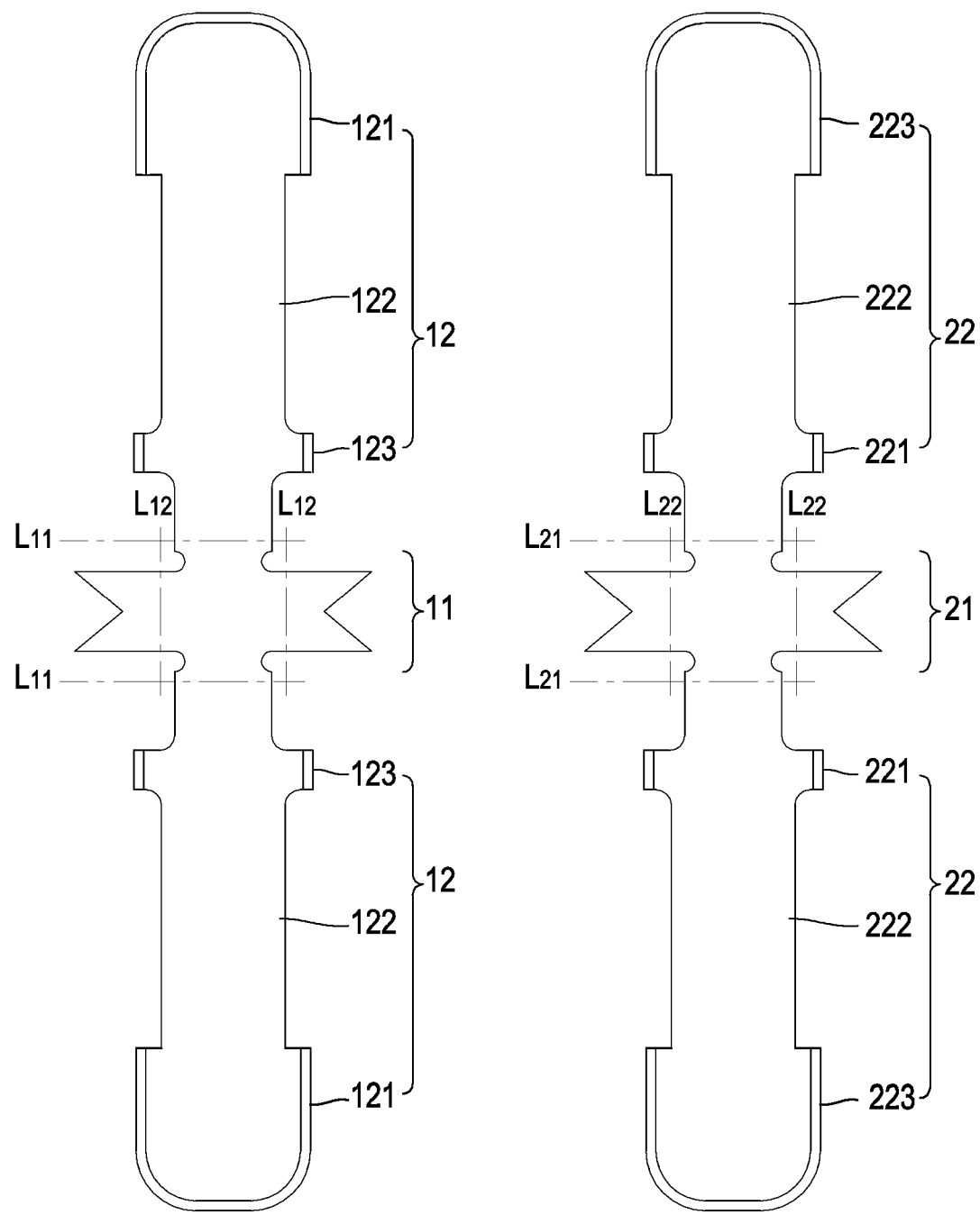
FIG. 4 is a planar view illustrating an upper probe portion and a lower probe portion of the outer cylindrical spring pin according to the first embodiment of the present disclosure.
Figure 5:
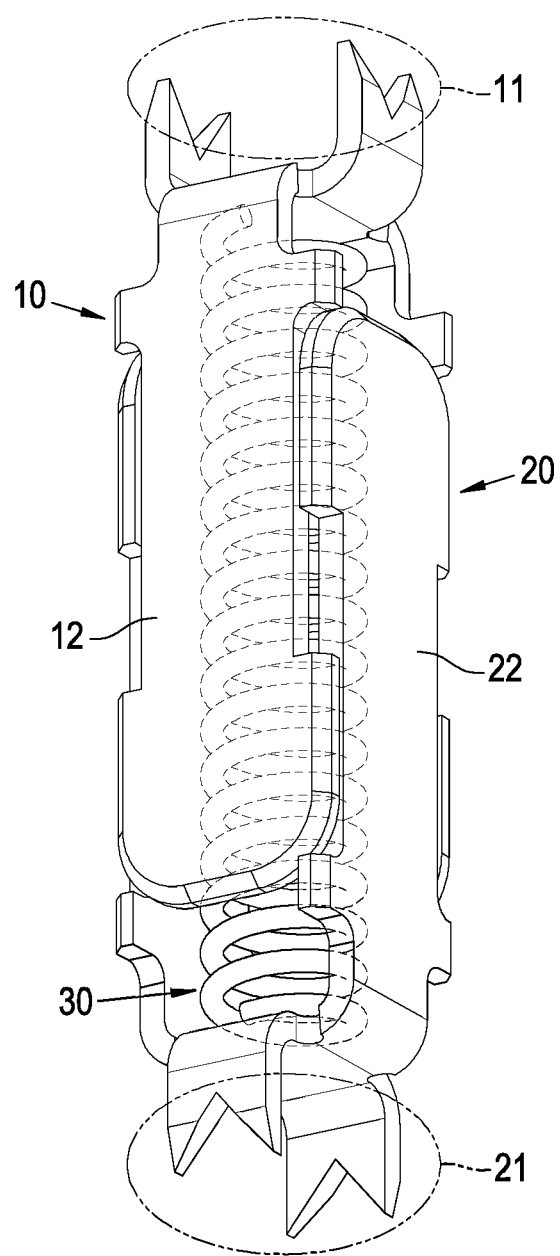
FIG. 5 is a perspective view illustrating an external appearance of the outer cylindrical spring pin when a length of the outer cylindrical spring pin is reduced by applying an external force to both ends of the outer cylindrical spring pin according to the first embodiment of the present disclosure in a longitudinal direction.

FIG. 2 is a perspective view illustrating an external appearance of an outer cylindrical spring pin according to a first embodiment of the present disclosure. FIG. 3 is an exploded perspective view illustrating the outer cylindrical spring pin according to the first embodiment of the present disclosure. FIG. 4 is a planar view illustrating an upper probe portion and a lower probe portion of the outer cylindrical spring pin according to the first embodiment of the present disclosure. FIG. 5 is a perspective view illustrating an external appearance of the outer cylindrical spring pin when a length of the outer cylindrical spring pin is reduced by applying an external force to both ends of the outer cylindrical spring pin according to the first embodiment of the present disclosure in a longitudinal direction.

The outer cylindrical spring pin according to the first embodiment of the present disclosure is capable of being extended and retracted, and is used where an electrical connection is required. Typically, the outer cylindrical spring pin may be used in a test socket of a semiconductor element, a socket for mounting a semiconductor element, and so on.

The outer cylindrical spring pin according to the first embodiment of the present disclosure includes an integrated upper probe 10, an integrated lower probe 20, and a compression spring 30.

The compression spring 30 applies a spring force to the integrated upper probe 10 and the integrated lower probe 20. Further, a first end of the compression spring 30 is supported by an inner surface of an upper probe portion 11 of the integrated upper probe 10, and a second end of the compression spring 30 is supported by an inner surface of a lower probe portion 21 of the integrated lower probe 20. Therefore, when the first end and the second end of the compression spring 30 are compressed, the compression spring 30 applies a spring force that resists the compression.

The integrated upper probe 10 is integrally provided with the upper probe portion 11 that is for contacting the outside, and with two upper probe side wall portions 12 which respectively extend opposite sides from each other from the upper probe portion 11 and which surround two side surfaces that are facing each other, among four side surfaces of the compression spring 30.

In addition, the integrated lower probe 20 is integrally provided with the lower probe portion 21 that is for contacting the outside, and with two lower probe side wall portions 22 which respectively extend opposite sides from each other from the lower probe portion 21 and which surround other two side surfaces between the two side surfaces that is surrounded by the upper probe side wall portions 12, among the four side surfaces of the compression spring 30.

The upper probe portion 11 and the lower probe portion 21 are for contacting the outside such as a conductive pad of a PCB, a terminal of a semiconductor element, and so on. Further, the upper probe portion 11 and the lower probe portion 21 may have a crown shape, a triangular pyramid shape, or a cone shape, and may have a single or a plurality of crown shapes, triangular pyramid shapes, or cone shapes. In addition, the upper probe portion 11 and the lower probe portion 21 may be formed in a flat shape without having such a crown shape, a triangular pyramid shape, and a cone shape.

The upper probe portion 11 and the lower probe portion 21 may have any shape that is for electrical contact to the outside of a spring pin, and the shape may be selected on the basis of characteristics and a shape of an external component that is required to be mainly in contact with the upper probe portion 11 and the lower probe portion 21.

The integrated upper probe 10 has the two upper probe side wall portions 12 that extend to the opposite sides around the upper probe portion 11, and the two upper probe side wall portions 12 are facing each other and may have the same shape as each other. After the spring pin is assembled, the two upper probe side wall portions 12 respectively have an angle bent approximately 90 degrees with respect to a base portion of the upper probe portion 11. However, before the spring pin is assembled, since the two upper probe side wall portions 12 are manufactured such that a distance between two free ends of the two upper probe side wall portions 12 is closer than the distance after the spring pin is assembled, the two upper probe side wall portions 12 may elastically contact the two lower probe side wall portions 22 that are interposed between the two free ends.

The integrated lower probe 20 has the two lower probe side wall portions 22 that extend to the opposite sides around the lower probe portion 21, and the two lower probe side wall portions 22 are facing each other and may have the same shape as each other. After the spring pin is assembled, the two lower probe side wall portions 22 respectively have an angle bent approximately 90 degrees with respect to a base portion of the lower probe portion 21. However, before the spring pin is assembled, since the two lower probe side wall portions 22 are manufactured such that a distance between two free ends of the two lower probe side wall portions 22 is closer than the distance after the spring pin is assembled, the two lower probe side wall portions 22 may elastically contact the two upper probe side wall portions 12 that are interposed between the two free ends.

The two upper probe side wall portions 12 and the two lower probe side wall portions 22 are alternately coupled to each other so as to cover open side surfaces of each other.

The two upper probe side wall portions 12 and the two lower probe side wall portions 22 have a shape surrounding side surfaces of the compression spring 30 in four directions, but are partially exposing and surrounding the compression spring 30 rather than surrounding entire of the side surfaces of the compression spring 30. From a state in which the spring pin is not applied with the external force, as the length of the spring pin is reduced by receiving the external force, a ratio of a surrounded area of the spring pin to an open area of the spring pin increases.

The integrated upper probe 10 has an approximately U shape, and the upper probe portion 11 and the two upper probe side wall portions 12 have a U shape. The integrated lower probe 20 also has an approximately U shape, and the lower probe portion 21 and the two lower probe side wall portions 22 have a U shape.

Each of the upper probe side wall portions 12 includes a first linear plate 122 that extends in a longitudinal direction from the upper probe portion 11, and includes a first pressing head 121 that extends in the longitudinal direction from the first linear plate 122. The first linear plate 122 extends from the upper probe portion 11, and extends long in the longitudinal direction (i.e., a vertical direction) after the first linear plate 122 is bent. Each of the first linear plates 122 configures a major planar surface that surrounds one of the side surfaces of the compression spring 30, and also first side surfaces S1 of the first linear plate 122 provide a sliding surface on which a second pressing head 221 of each of the lower probe side wall portions 22 is capable of being slid. Further, preferably, in order to provide the sliding surface, the first side surfaces S1 of the first linear plate 122 are formed in a rectilinear shape.

Each of the lower probe side wall portions 22 includes a second linear plate 222 that extends in the longitudinal direction from the lower probe portion 21, and includes the second pressing head 221 that extends in the longitudinal direction from the second linear plate 222. The second linear plate 222 extends from the lower probe portion 21, and extends long in the longitudinal direction (i.e., the vertical direction) after the second linear plate 222 is bent. Each of the second linear plates 222 configures a major planar surface that surrounds one of the side surfaces of the compression spring 30, and also second side surfaces S2 of the second linear plate 222 provides a sliding surface on which the first pressing head 121 of each of the upper probe side wall portions 12 is capable of being slid. Further, preferably, in order to provide the sliding surface, the second side surfaces S2 of the second linear plate 222 are formed in a rectilinear shape.

The upper probe side wall portions 12 and the lower probe side wall portions 22 can be slid on each other while being in contact with each other when the external force is applied. When the external force is applied to the both ends of the spring pin, the upper probe side wall portions 12 and the lower probe side wall portions 22 that correspond to a conventional outer cylinder can be slid on each other relatively, thereby performing a function of an electrical passage. The two upper probe side wall portions 12 and the two lower probe side wall portions 22 configure a quadrangular cylinder shape, and become an outer cylinder of the compression spring 30, thereby becoming the electrical passage where the two upper probe side wall portions 12 and the two lower probe side wall portions 22 are capable of being slid on each other.

When the external force is applied to the both ends of the spring pin, the spring pin is capable of being extended and retracted. Further, the first pressing head 121 of each of the upper probe side wall portions 121 is slid while pressing the second side surface S2 of the second linear plate 222 of the each of the lower probe side wall portions 22, and the second pressing head 222 of each of the lower probe side wall portions 222 is slid while pressing the first side surfaces S1 of the first linear plate 122 of the each of the upper probe side wall portions 12.

On each of the upper probe side wall portions 12, a step is formed between the first linear plate 122 and the first pressing head 121. Further, the step protrudes since a width of the first pressing head 121 is wider than a width of the first linear plate 122, so that the step restricts the second pressing head 221 of each of the lower probe side wall portions 22 from separating downward. In addition, on each of the lower probe side wall portions 22, a step is formed between the second linear plate 222 and the second pressing head 221. Further, the step protrudes since a width of the second pressing head 221 is wider than a width of the second linear plate 222, so that the step restricts the first pressing head 121 of each of the upper probe side wall portions 12 from separating upward.

After the integrated upper probe 10 and the integrated lower probe 20 are coupled to each other while the compression spring 30 is placed therebetween, a natural separation of the integrated upper probe 10 and the integrated lower probe 20 are prevented due to the structure as described above. Therefore, there is an advantage that a manufacturing process that will be performed after the assembly of the integrated upper probe 10 and the integrated lower probe 20 may be easily performed.

Each of the upper probe side wall portions 12 further includes a first stop protrusion 123 that protrudes from a side surface of the first linear plate 122, and each of the lower probe side wall portions 22 further includes a second stop protrusion 223 that protrudes from a side surface of the second linear plate 222. Further, the first stop protrusion 123 and the second stop protrusion 223 will be described later.

Electrical signals and current are transmitted between the upper probe portion 11 and the lower probe portion 21 that are contacting the outside. At this time, the electrical signals and the current are transmitted through the two upper probe side wall portions 12 and the two lower probe side wall portions 22.

A total of eight contact surfaces can be seen on contact surfaces between the two upper probe side wall portions 12 and the two lower probe side wall portions 22. The both of the first side surfaces S1 of the first linear plate 122 of one of the upper probe side wall portions 12 configure surfaces where each second pressing head 222 of the two lower probe side wall portions 22 contacts. Further, a lower surface of each first pressing head 121 of the same upper probe side wall portions 12 configure surfaces where each second pressing head 221 of the two lower probe side wall portions 22 contacts. Therefore, a total of four contact surfaces are provided. In addition, a total of four contact surfaces are provided similarly through the other upper probe side wall portion 12.

In an electrical contact, as an area of the contact surface increases, impedance that causes the reduction in electrical characteristics is reduced. Therefore, since the spring pin according to an embodiment of the present disclosure is formed in an outer cylindrical shape and also has a larger contact surface, there is an effect that the electrical characteristics may be drastically increased.

Hereinafter, referring to FIGS. 2 to 5, more particularly referring to FIG. 4, a method of manufacturing the outer cylindrical spring pin according to the first embodiment of the present disclosure will be briefly described.

The method of manufacturing the outer cylindrical spring pin includes a stamping process, a plating process, and an assembling process.

In the stamping process, a metal plate material is processed by performing a progressive stamping that includes a punching process and a bending process, thereby manufacturing the integrated upper probe 10 and the integrated lower probe 20. In the progressive stamping, the metal plate material is obtained. For example, a metal plate material cut as in the planar view illustrated in FIG. 4 by performing one or multiple punching on a metal plate material having a long strip shape is obtained, or a metal plate material further including a connection portion (frame) (which is subsequently removed) that connects a series of components provided on side surfaces of the metal plate material is obtained. In the embodiment as described above, the shape of the integrated upper probe 10 and the shape of the integrated lower probe 20 are the same, but may have shapes different from each other according to differences in shapes of the probe portions and so on.

In addition, a process of performing a bending on the upper probe portion 11 with respect to a second upper bending line L12 so as to form a shape that will become a crown shape or the like to contact the outside, and a process of performing a bending on the upper probe portion 11 with respect to a first upper bending line L11 such that the two upper probe side wall portions 12 that extend opposite directions around the upper probe portion 11 are formed in a U shape are provided. According to the shape of the upper probe portion 11, the process of performing the bending so as to form a shape such as a crown may be omitted and a process such as coining may be used. Further, preferably, in the process of performing the bending to form the U shape, a bending angle has an angle more than 90 degrees so as to realize an elastic contact between the pressing head and the linear plate.

In addition, a process of performing a bending on the lower probe portion 21 with respect to a second lower bending line L22 so as to form a shape that will become a crown shape or the like to contact the outside, and a process of performing a bending on the lower probe portion 21 with respect to a first lower bending line L21 such that the two lower probe side wall portions 22 that extends in opposite directions around the lower probe portion 21 are formed in a U shape are provided. According to the shape of the lower probe portion 21, the process of performing the bending so as to form a shape such as a crown may be omitted and a process such as coining may be used. Further, preferably, in the process of performing the bending to form the U shape, a bending angle has an angle more than 90 degrees so as to realize an elastic contact between the pressing head and the linear plate.

A conventional spring formed by coiling such as a linear spring steel to have a cylindrical shape is used as the compression spring 30. Further, the integrated upper probe 10 and the integrated lower probe 20 are processed by performing the progressive stamping including the punching and the bending of the metal plate material.

In addition, in order to increase electrical characteristics, the plating process performing plating the integrated upper probe 10 and the integrated lower probe 20 may be included before the assembling process is performed.

In addition, the assembling process in which the integrated upper probe 10 and the integrated lower probe 20 are assembled while the compression spring 30 is placed therebetween is provided. In the assembling process, in a state in which the upper probe side wall portions 12 and the lower probe side wall portions 22 are alternately positioned from each other, the integrated upper probe 10 and the integrated lower probe 20 are assembled by allowing the first pressing head 121 of the upper probe side wall portions 12 to be moved over the second pressing head 221 of the lower probe side wall portions 22 or by allowing the second pressing head 221 of the lower probe side wall portions 22 to be moved over the first pressing head 121 of the upper probe side wall portions 12.

According to the present disclosure, since respective side wall portions 12 and 22 that extend from the upper probe portion 11 and the lower probe portion 21 perform a function of an outer cylinder, a strict tolerance management required in a structure in which an outer cylinder and an upper probe are separated from each other and the outer cylinder and a lower probe are separated from each other, such as a conventional outer cylindrical spring pin, are no longer required. Therefore, there is an effect that a manufacturing cost of the outer cylindrical spring pin may be drastically reduced.

Figures 6A, 6B:
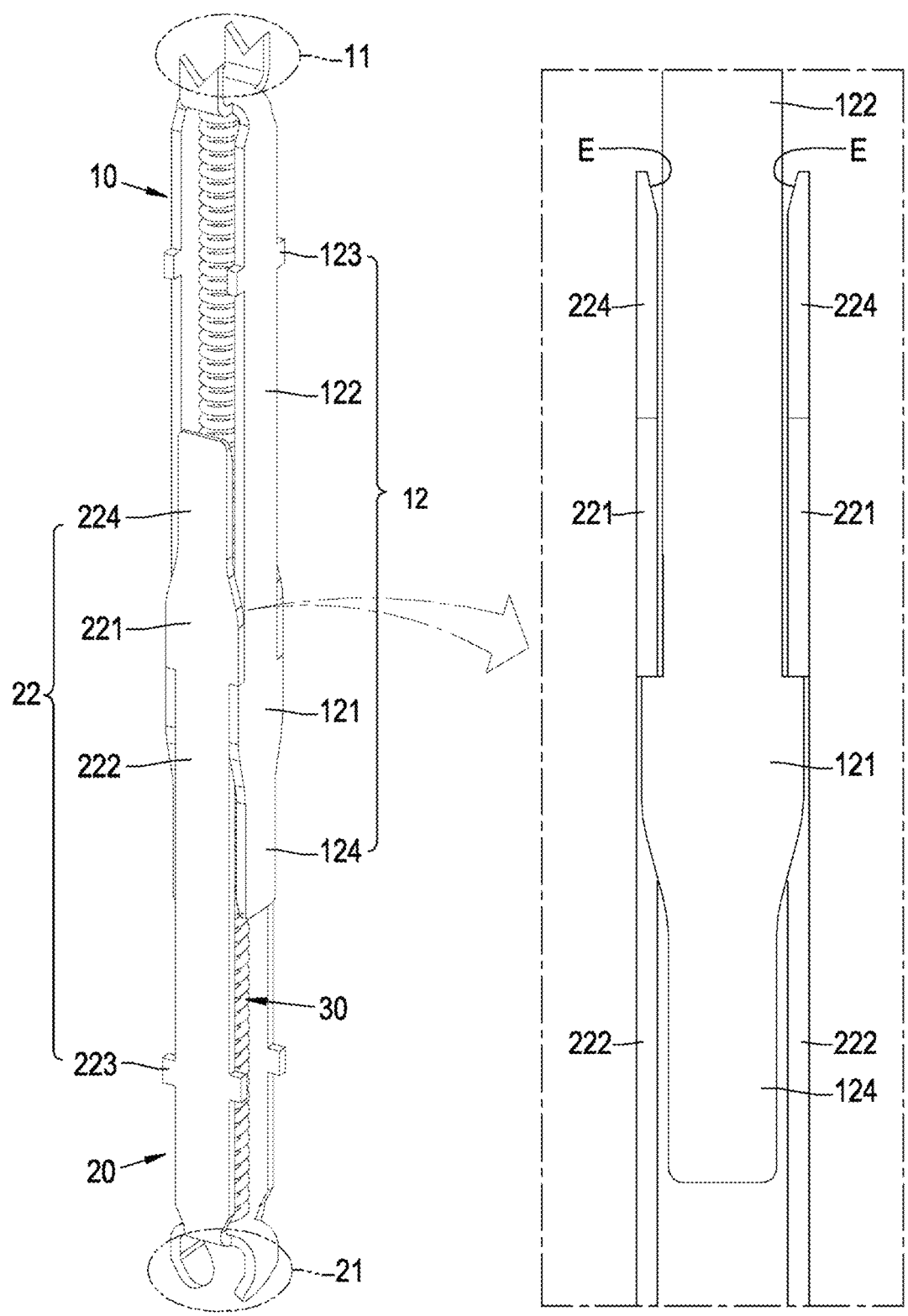
FIG. 6A is a perspective view illustrating the outer cylindrical spring pin according to a second embodiment of the present disclosure.
FIG. 6B is a partial side view illustrating the outer cylindrical spring pin according to the second embodiment of the present disclosure.

FIG. 6A is a perspective view illustrating the outer cylindrical spring pin according to a second embodiment of the present disclosure, and FIG. 6B is a partial side view illustrating the outer cylindrical spring pin according to the second embodiment of the present disclosure.

Comparing to the outer cylindrical spring pin of the first embodiment, the outer cylindrical spring pin of the second embodiment has a shape slightly different from the shape of the lower probe portion 21 and has a structure slightly different from a structure of the lower probe side wall portions 22, but most of configuration thereof are the same or similar. Further, the description of the same or similar configurations may be omitted.

The lower probe portion 21 has a point portion which extends from the base portion and which is formed in a circular disc shape having a thickness. Further, comparing to a point portion formed in a triangular pyramid shape, the point portion formed in the circular disc shape may be more suitable for the application allowing scratches applied on an external pad or an external terminal to be reduced.

The upper probe side wall portions 12 has a first extension plate 124 in which the first pressing head 121 extends downward. Further, similar to the first linear plate 122, the first extension plate 124 surrounds the compression spring 30. The lower probe side wall portions 22 has a second extension plate 224 in which the second pressing head 221 extends upward. Further, similar to the second linear plate 222, the second extension plate 224 surrounds the compression spring 30.

in the spring pin that has a longer length, the configuration of the first and second extension plates 124 and 224 has an effect of increasing an area surrounding the compression spring 30, and supports upright stability of the spring pin inside a through hole 434 (see FIG. 7A) of an insulating body 40.

The end portion of the upper probe side wall portions 12 and the end portion of the lower probe side wall portions 22, which is specifically the end portion of the first and second extension plates 124 and 224, are respectively provided with an inclined portion E. Further, the inclined portion E is provided such that a space increasing toward ends of the first and the second extension plates 124 and 224 from between the side surfaces of two linear plates (more specifically, an extension surface connecting the side surfaces of the two linear plates) and the compression spring 30, and may be formed in a flat surface shape or a curved surface shape. The inclined portion E may have a chamfered shape formed at the end portion of each of the first and the second extension plate 124 and 224, and may be formed by performing a polishing process, a forming process by pressing the end portion, a coining process, or the like.

Such an inclined portion E may be formed on an end portion of each pressing head in the first embodiment.

The inclined portion E facilitates a moving over the side surface of the pressing head in the assembling process, and has an effect that interference with the compression spring during operation is definitely blocked.

Figure 7A:
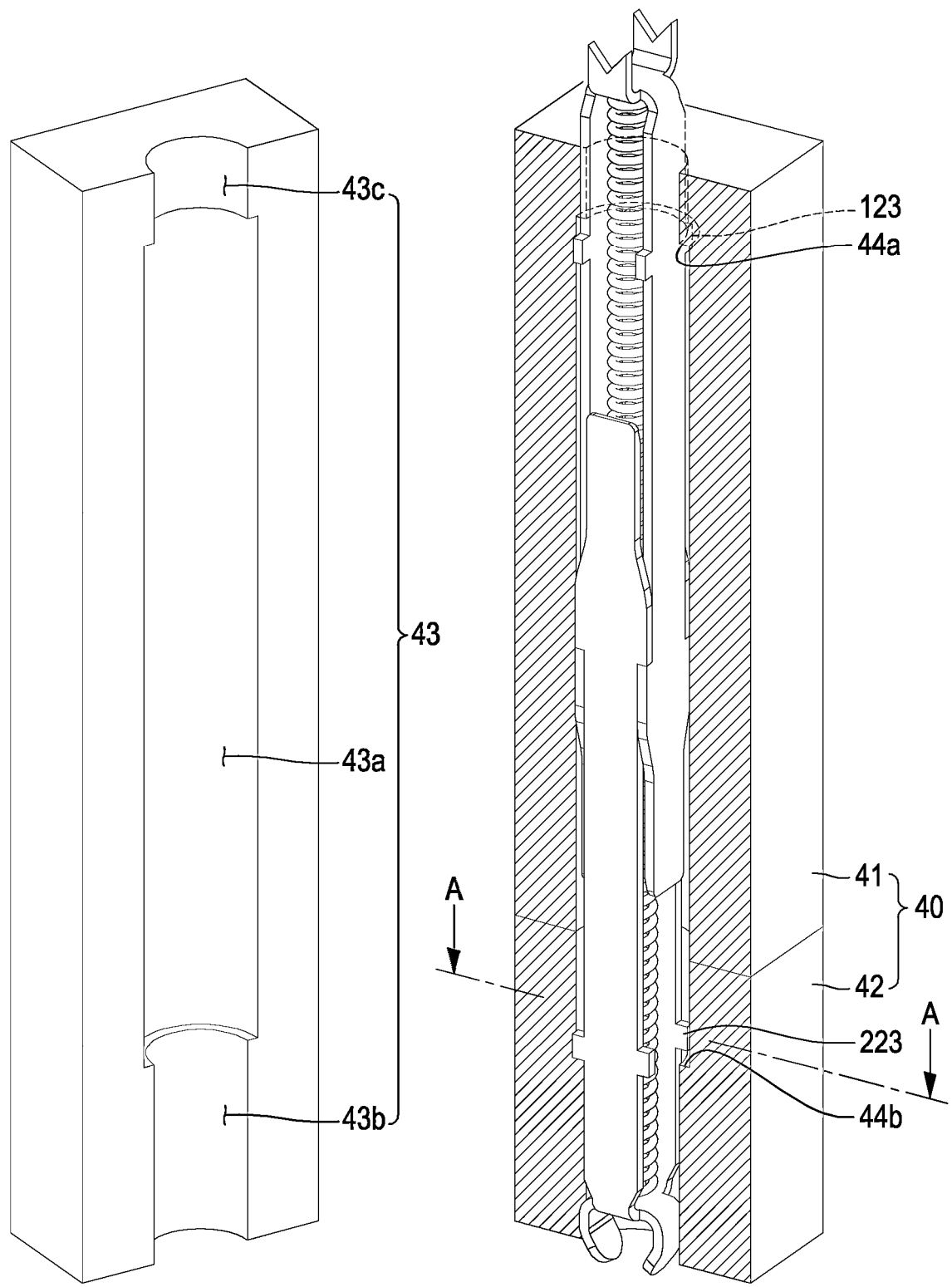
FIG. 7A shows cross-sectional views illustrating a state in which the outer cylindrical spring pin according to the second embodiment of the present disclosure is accommodated in an insulating body.
Figure 7B:
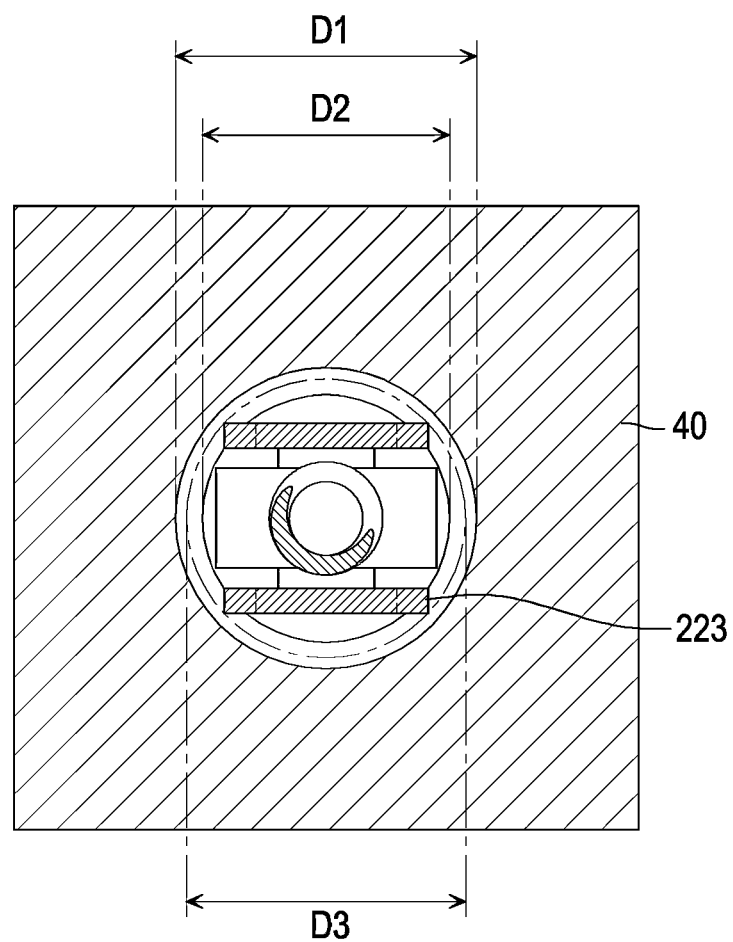
FIG. 7B is a cross-sectional view taken along line A-A when the outer cylindrical spring pin according to the second embodiment of the present disclosure is accommodated in the insulating body.

FIG. 7A shows cross-sectional views illustrating a state in which the outer cylindrical spring pin according to the second embodiment of the present disclosure is accommodated in an insulating body, and FIG. 7B is a cross-sectional view taken along line A-A when the outer cylindrical spring pin according to the second embodiment of the present disclosure is accommodated in the insulating body.

The insulating body 40 is provided with the through hole 43 that penetrates between a first surface and a second surface that faces the first surface. Further, in one insulating body 40, the through hole 43 is arranged in a two-dimensional array. For example, in a test socket for testing 1000 terminals, 1000 through holes are arranged in an array.

The test socket is provided with the insulating body 40, and the outer cylindrical spring pin is placed in each of the through hole 43 of the insulating body 40. In a process of assembling the test socket, the test socket may be assembled by performing bolting (not illustrated) or the like to couple the test socket after the outer cylindrical spring pins are placed in one side of a first body portion 41 and a second body portion 42 of the insulating body 40 and other side of the test socket is covered.

Each of the upper probe side wall portions 12 further includes the first stop protrusion 123 that protrudes from the side surfaces of the first linear plate 123, and the upward movement of the upper probe 10 is restricted by a first step portion 44*a* of the insulating body 40 in which the outer cylindrical spring pin is accommodated. Each of the lower probe side wall portions 22 further includes the second stop protrusion 223 that protrudes from the side surfaces of the second linear plate 123, and the downward movement of the lower probe 20 is restricted by a second step portion 44*b* of the insulating body 40 in which the outer cylindrical spring pin is accommodated.

In order to form the first and second step portions 44*a* and 44*b*, the through hole 40 has a first inner diameter D1 that is a larger inner diameter and has a second inner diameter D2 that is a lower inner diameter. In the through hole 40, the first inner diameter of a first through hole portion 43*a* is larger than the second inner diameter D2 of a second through hole portion 43*b* and a third through hole portion 43*c*. In addition, an outer diameter D3 of the second stop protrusion 223 is smaller than the first inner diameter D1 of the through hole 40 and is larger than the second inner diameter D2 of the through hole 40.

The invention claimed is:

1. An outer cylindrical spring pin comprising:
   a compression spring (30);
   an integrated upper probe (10) integrally provided with an upper probe portion (11) that is for contacting an outside, and with two upper probe side wall portions (12) which respectively extend opposite sides from each other from the upper probe portion (11) and which surround two side surfaces that are facing each other, among four side surfaces of the compression spring (30); and
   an integrated lower probe (20) integrally provided with a lower probe portion (21) that is for contacting the outside, and with two lower probe side wall portions (22) which respectively extend opposite sides from each other from the lower probe portion (21) and which surround other two side surfaces between the two side surfaces that is surrounded by the upper probe side wall portions (12), among the four side surfaces of the compression spring (30),
   wherein, when an external force is applied, the upper probe side wall portions (12) and the lower probe side wall portions (22) are capable of being slid on each other while being in contact with each other.

2. The outer cylindrical spring pin of claim 1, wherein the upper probe portion (11) and the two upper probe side wall portions (12) are configured to form a U shape, and
   the lower probe portion (21) and the two lower probe side wall portions (22) are configured to form a U shape.

3. The outer cylindrical spring pin of claim 1, wherein each of the upper probe side wall portions (12) comprises:
   a first linear plate (122) that extends from the upper probe portion (11) in a longitudinal direction; and
   a first pressing head (121) which is formed in a plate shape and which extends from the first linear plate (122) in the longitudinal direction, and
   each of the lower probe side wall portions (22) comprises:
   a second linear plate (222) that extends from the lower probe portion (21) in the longitudinal direction; and
   a second pressing head (221) which is formed in a plate shape and which extends from the second linear plate (222) in the longitudinal direction.

4. The outer cylindrical spring pin of claim 3, wherein each of the upper probe side wall portions (12) further comprises a first stop protrusion (123) that protrudes from side surfaces of the first linear plate (122) so that an upward movement of the integrated upper probe (10) is restricted by a first step portion of an insulating body (40) in which the outer cylindrical spring pin is accommodated, and
   each of the lower probe side wall portions (22) further comprises a second stop protrusion (223) that protrudes from side surfaces of the second linear plate (222) so that a downward movement of the integrated lower probe (20) is restricted by a second step portion of the insulating body (40) in which the outer cylindrical spring pin is accommodated.

5. The outer cylindrical spring pin of claim 3, wherein the first pressing head (121) of each of the upper probe side wall portions (12) is configured to be slid while pressing second side surfaces (S2) of the second linear plate (222) of the each of the lower probe side wall portions (22), and
   the second pressing head (221) of each of the lower probe side wall portions (22) is configured to be slid while pressing first side surfaces (S1) of the first linear plate (122) of the each of the upper probe side wall portions (12).

6. The outer cylindrical spring pin of claim 5, wherein the second pressing head (221) of each of the lower probe side wall portions (22) is restricted from separating downward since a width of the first pressing head (121) on the each of the upper probe side wall portions (12) is wider than a width of the first linear plate (122) and protrudes, and
   the first pressing head (121) of each of the upper probe side wall portions (12) is restricted from separating upward since a width of the second pressing head (221) on the each of the lower probe side wall portions (22) is wider than a width of the second linear plate (222) and protrudes.

7. The outer cylindrical spring pin of claim 1, wherein the compression spring (30) is formed by coiling a linear spring steel to be formed in a cylindrical shape, and the integrated upper probe (10) and the integrated lower probe (20) are formed by processing a metal plate material by performing a progressive stamping that comprises a punching process and a bending process.

8. The outer cylindrical spring pin of claim 1, wherein the two upper probe side wall portions (12) and the two lower probe side wall portions (22) configure a quadrangular cylinder shape, and become an outer cylinder of the compression spring (30), thereby becoming an electrical passage where the two upper probe side wall portions (12) and the two lower probe side wall portions (22) are capable of being slid on each other.

9. A method of manufacturing an outer cylindrical spring pin, the method comprising:
  a stamping process in which an integrated upper probe (10) and an integrated lower probe (20) are manufactured by processing a metal plate material with a progressive stamping that comprises a punching process and a bending process; and
  an assembling process in which the integrated upper probe (10) and the integrated lower probe (20) are assembled while a compression spring (30) is placed therebetween,
  wherein the stamping process comprises:
  a process of bending two upper probe side wall portions (12) when the integrated upper probe (10) is manufactured, the two upper probe side wall portions (12) extending in opposite directions around an upper probe portion (11) that is for contacting an outside, such that a U shape is formed; and
  a process of bending two lower probe side wall portions (22) when the integrated lower probe (20) is manufactured, the two lower probe side wall portions (22) extending in opposite directions around a lower probe portion (21) that is for contacting the outside, such that a U shape is formed.

10. The method of claim 9, wherein, in the assembling process, in a state in which the upper probe side wall portions (12) and the lower probe side wall portions (22) are alternately positioned from each other, the integrated upper probe (10) and the integrated lower probe (20) are assembled by allowing a first pressing head (121) of each of the upper probe side wall portions (12) to be moved over a second pressing head (221) of each of the lower probe side wall portions (22) or by allowing the second pressing head (221) of each of the lower probe side wall portions (22) to be moved over the first pressing head (121) of each of the upper probe side wall portions (12), and
  the method further comprises a plating process before the assembling process, the plating process performing plating of the integrated upper probe (10) and the integrated lower probe (20).

11. A test socket comprising:
  a plurality of outer cylindrical spring pins according to claim 1; and
  an insulating body having through holes which penetrate between a first surface and a second surface that is facing the first surface and which are arranged in an array,
  wherein the outer cylindrical spring pins are inserted in the through holes, respectively.

12. The outer cylindrical spring pin of claim 1, wherein a distance between free ends of the two upper probe side wall portions (12) and the two lower probe side wall portions (22) before an assembly process is performed is closer than the distance after the assembly process is performed.

* * * * *